(12) United States Patent
Tailliet

(10) Patent No.: US 8,792,262 B2
(45) Date of Patent: Jul. 29, 2014

(54) NONVOLATILE MEMORY WITH BITLINE CAPACITIVE COUPLING COMPENSATION

(75) Inventor: Francois Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 261 days.

(21) Appl. No.: 13/482,727

(22) Filed: May 29, 2012

(65) Prior Publication Data

US 2012/0307563 A1    Dec. 6, 2012

(30) Foreign Application Priority Data

May 30, 2011    (FR) ...................................... 11 54718

(51) Int. Cl.
*G11C 7/02* (2006.01)
(52) U.S. Cl.
USPC ............................................. 365/53; 365/51

(58) Field of Classification Search
USPC ........................................ 365/53, 51, 185.18
See application file for complete search history.

(56) References Cited

U.S. PATENT DOCUMENTS

| | | | |
|---|---|---|---|
| 2005/0072999 A1* | 4/2005 | Matamis et al. .............. | 257/314 |
| 2005/0117378 A1* | 6/2005 | Cho et al. ........................ | 365/63 |
| 2007/0140002 A1 | 6/2007 | Lambrache et al. | |

* cited by examiner

*Primary Examiner* — Vu Le
(74) *Attorney, Agent, or Firm* — Seed IP Law Group PLLC

(57) ABSTRACT

A method of programming memory cells in a nonvolatile memory, includes applying a programming voltage to a first bitline and setting a second bitline in a floating state. The method further includes applying a compensation voltage to a shield conductive line coupled to the bitline set in the floating state, and setting in the floating state a shield conductive line coupled to the bitline receiving the programming voltage. The method is applicable to the reduction of the parasitic programming phenomena of memory cells by capacitive coupling between bitlines.

17 Claims, 8 Drawing Sheets

NONVOLATILE MEMORY WITH BITLINE CAPACITIVE COUPLING COMPENSATION

BACKGROUND

1. Technical Field

The present disclosure relates to a nonvolatile memory comprising at least one bitline and at least one memory cell linked to the bitline, and means for applying a programming voltage to the bitline or for setting the bitline in a floating state.

The present disclosure also relates to a method of programming memory cells in a nonvolatile memory comprising at least two bitlines to which the memory cells are linked, comprising a step of applying a programming voltage to a first bitline and of setting a second bitline in a floating state.

2. Description of the Related Art

FIG. 1 schematically shows, in cross-section, a conventional nonvolatile memory structure M1 integrated in a semiconductor microchip. The memory comprises a semiconductor substrate 10 in which memory cells 12 are formed. The memory cells 12 are linked by contacts 21 to electrically conductive bitlines BL ($BL_{i-1}$, $BL_i$, $BL_{i+1}$). The bitlines BL are embedded in a dielectric material 20 that covers the substrate 10. The memory cells 12 linked to a same bitline BLi are isolated from memory cells linked to adjacent bitlines BLi−1, BLi+1 by electrically isolating trenches 11.

Programming data in a group of memory cells generally comprises a step of erasing the group of memory cells, followed by a step of selectively programming memory cells. During the programming step, the bitlines BL linked to memory cells to be programmed receive a programming voltage Vhv, whereas the bitlines linked to memory cells to remain in the erased state are set in a floating state FLT, that is to say, disconnected from the rest of the circuit.

Due to the increasingly strict miniaturization specifications for integrated circuits, the distance separating two bitlines tends to reduce as well. A typical distance between two bitlines is for example 0.24 microns. This reduced distance causes a capacitive coupling between adjacent bitlines, resulting in the appearance of electrical field lines 22 between the bitlines receiving the voltage Vhv and the floating bitlines.

A floating bitline $BL_i$ next to a bitline $BL_{i-1}$ receiving the voltage Vhv finds itself brought to a parasitic potential Vf1 that tends to increase under the effect of capacitive coupling. The capacitive coupling effect is even more pronounced when the floating bitline $BL_i$ is surrounded by two lines $BL_{i-1}$ and $BL_{i+1}$ receiving the voltage Vhv. The equivalent electrical diagram shown in FIG. 2 shows that in such a case, the potential Vf1 of the bitline $BL_i$ may be estimated by means of the following equation:

$$Vf1 = 2Vhv * C2/(C1+2C2) \quad \text{(equation 1)}$$

wherein C1 is the capacitive coupling between the bitline $BL_i$ and the ground of the circuit, and C2 is the parasitic capacitive coupling between the bitline and each of the adjacent bitlines $BL_{i-1}$ and $BL_{i+1}$. In practice, the parasitic potential Vf1 can reach 8 to 9 V for a voltage Vhv on the order of 15 V.

This parasitic potential Vf1 can cause an involuntary injection of electrical charges in erased memory cells, leading to a parasitic programming of these memory cells.

To resolve this problem, the bitlines that do not need to receive the voltage Vhv may be grounded. This solution is however not desirable due to the existence of leakage currents i1 circulating between the memory cells 12 and ground (in particular between the drain regions of the memory cells and ground), and leakage currents i2 circulating between the memory cells receiving the voltage Vhv and the memory cells linked to floating bitlines (currents passing under the isolating trenches 11). The leakage currents i2 are weak, on the nano-ampere level, and are limited by the potential Vf1. Grounding the bitlines that should not receive the voltage Vhv would lead to a considerable increase of leakage currents i2, which could reach the microampere level. Such an increase of leakage currents could cause the voltage source supplying the voltage Vhv, such as a charge pump, to collapse.

BRIEF SUMMARY

One embodiment of the present disclosure provides another way to reduce the increase by capacitive coupling of the electrical potential of floating bitlines.

Some embodiments of the disclosure relate to a nonvolatile memory comprising at least one bitline and at least one memory cell linked to the bitline, first means for applying a programming voltage to the bitline or for setting the bitline in a floating state, a shield conductive line extending above the bitline, capacitively coupled to the bitline, and second means for applying a compensation voltage to the shield conductive line when the bitline is set in the floating state, and setting the shield conductive line in the floating state when the programming voltage is applied to the bitline.

According to one embodiment, the first means comprises a first control switch of the voltage of the bitline, and a first latch supplying a control signal of the first control switch as a function of the value of a data bit stored by the latch, and the seconds means comprises a second control switch of the voltage of the shield conductive line, and a second latch supplying a control signal of the second control switch as a function of the value of a data bit stored by the latch.

According to one embodiment, the first means comprises a first control switch of the voltage of the bitline, and a first latch supplying a control signal of the first control switch as a function of the value of a data bit stored by the latch, and the second means comprises a second control switch of the voltage of the shield conductive line, and control means of the second switch supplying a control signal of the second control switch as a function of the value of the control signal of the first switch.

According to one embodiment, the control means of the second switch comprises an inverting gate receiving the control signal of the first switch.

According to one embodiment, the compensation voltage is a ground potential of the memory.

According to one embodiment, the memory comprises rows of memory cells, a plurality of bitlines, each bitline being capacitively coupled to at least one adjacent bitline, a plurality of shield conductive lines arranged above the bitlines, and means for applying the programming voltage to first bitlines, setting second bitlines in the floating state, setting the shield conductive lines extending above the first bitlines in the floating state, and applying the compensation voltage to the shield conductive lines extending above second bitlines.

According to one embodiment, a memory cell comprises an access transistor and a floating gate transistor.

According to one embodiment, a memory cell comprises a floating gate transistor without an access transistor.

Embodiments of the disclosure also relate to an electronic portable device comprising an integrated circuit IC comprising a nonvolatile memory according to the disclosure.

Embodiments of the disclosure also relate to a method of programming memory cells in a nonvolatile memory comprising at least two bitlines to which memory cells are linked, comprising a step of applying a programming voltage to a first bitline and of setting a second bitline in a floating state, comprising a step of providing a shield conductive line above each bitline and capacitively coupled to the bitline, and a step of applying a compensation voltage to the shield conductive line coupled to the bitline set in the floating state, and setting in the floating state the shield conductive line coupled to the bitline receiving the programming voltage.

According to one embodiment, the compensation voltage is a ground potential.

According to one embodiment, the method comprises the steps of providing first means comprising a first control switch of the voltage of the bitline, and a first latch supplying a control signal of the first control switch as a function of the value of a data bit stored by the latch, and second means comprising a second control switch of the voltage of the shield conductive line, and a second latch supplying a control signal of the second control switch as a function of the value of a data bit stored by the latch.

According to one embodiment, the method comprises the steps of providing first means comprising a first control switch of the voltage of the bitline, and a first latch supplying a control signal of the first control switch as a function of the value of a data bit $B_i$ stored by the latch, and second means comprising a second control switch of the voltage of the shield conductive line, and control means of the second switch supplying a control signal of the second control switch as a function of the value of the control signal of the first switch.

BRIEF DESCRIPTION OF THE SEVERAL VIEWS OF THE DRAWINGS

These features as well as others of the present disclosure will be disclosed in further detail in the following description, presented in a non-limiting manner in relation with the appended drawings among which.

DETAILED DESCRIPTION

Figure 1:
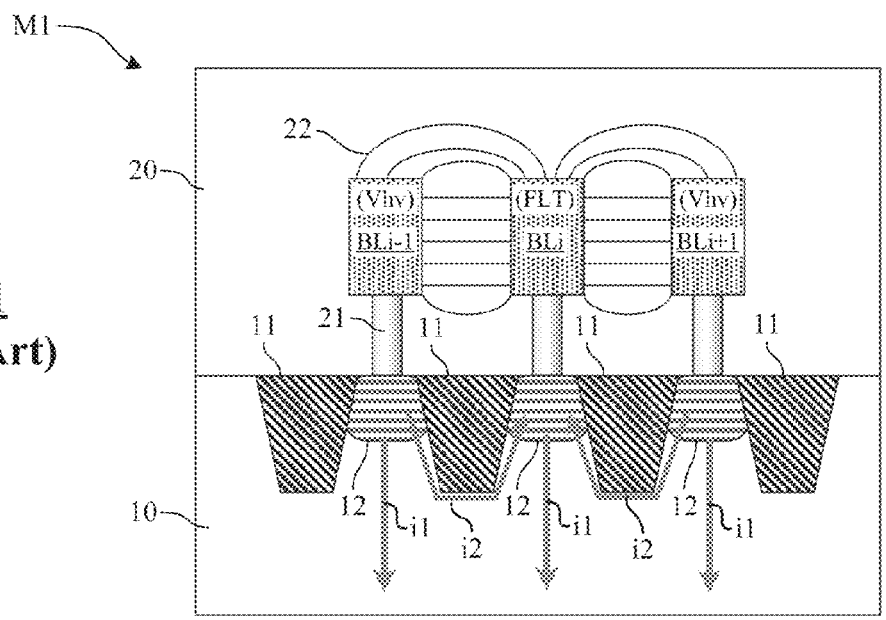
FIG. 1, previously described, is a schematic cross-sectional view of a conventional nonvolatile memory, FIG. 2, previously described, is an electrical diagram illustrating capacitive coupling of bitlines in the memory of FIG. 1, FIG. 3 schematically shows a cross-sectional view of a nonvolatile memory according to the disclosure.
Figure 2:
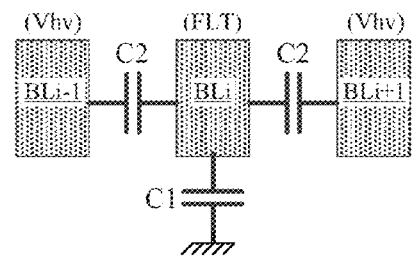
Figure 3:
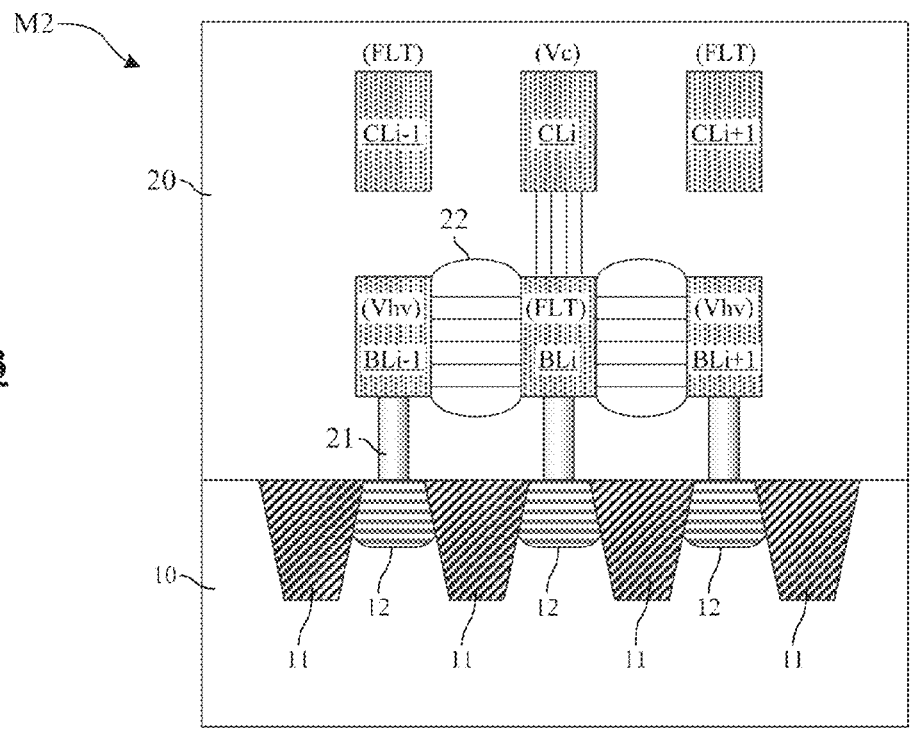

FIG. 3 schematically shows, in cross-section, an embodiment of a memory M2 according to the disclosure, integrated in a semiconductor chip. Memory M2 comprises a semiconductor substrate 10, for example of the P type or a P type well, in which memory cells 12 are formed. The region of memory cells 12 shown in cross-sectional view in FIG. 3 is a transistor drain region, shown along its width. The memory cells 12 are linked by contacts 21 to bitlines BL ($BL_{i-1}$, $BL_i$, $BL_{i+1}$), each bitline BL being linked to a plurality of memory cells (not shown in the cross-sectional view). The bitlines BL are embedded in a dielectric material 20 covering the substrate 10, generally deposited in several layers. The memory cells 12 linked to a same bitline BLi are isolated from memory cells linked to adjacent bitlines BLi−1, BLi+1 by isolating trenches 11, for example STI trenches ("Shallow Trench Isolation") of silicon dioxide (SiO2).

As previously indicated, the programming of data in a group of memory cells generally comprises a step of collectively erasing the group of memory cells followed by a step of programming certain memory cells. During the programming step, the bitlines linked to memory cells to be programmed receive a high programming voltage Vhv, for example 15 V, whereas the bitlines linked to memory cells to remain in the erased state are set in the floating state. As shown above, in a conventional memory, the floating bitlines can be subjected to a parasitic electrical potential Vf1 generated by capacitive coupling, which can lead to a parasitic programming of memory cells.

To reduce this parasitic potential, memory M2 comprises shield conductive lines CL ($CL_{i-1}$, $CL_i$, $CL_{i+1}$) arranged above the bitlines BL ($BL_{i-1}$, $BL_i$, $BL_{i+1}$) and also embedded in the dielectric 20. Preferably, each bitline BL is associated with a corresponding shield conductive line CL that overlies the bitline. Exceptions may be provided, for example bitlines at the edge of the memory array and that will thus never be between two bitlines receiving voltage Vhv.

The shield conductive lines CL are arranged at a distance from bitlines BL such that a capacitive coupling exists between each bitline and the shield conductive line overlying it.

In one embodiment, the distance between the shield conductive lines and the bitlines is identical to the distance between the bitlines, for example 0.4 microns. The bitlines and the conductive lines have the same thickness, for example 0.4 microns, and the same width, for example 0.24 microns.

In one embodiment, the bitlines are made by etching of a metal layer, for example the layer called "metal 1" in microelectronics, and the shield conductive lines are made by etching of a metal layer of a higher level, for example the layer "metal 2". The distance between the shield conductive lines and the bitlines is in this case determined by the thickness of a dielectric layer separating the different metal layers. This distance may however be reduced by a local etching of the dielectric layer, to increase the coupling between the shield conductive lines and the bitlines.

The shield conductive lines CL are not electrically linked to the bitlines and to the memory cells. They are brought to a compensation voltage Vc that is chosen in a manner to reduce if not limit an electrical potential that may appear by capacitive coupling in the bitlines when they are floating.

More particularly, and as shown in FIG. 3:
a shield conductive line CL, receives the compensation voltage Vc when the bitline $BL_i$ to which it is coupled is set in the floating state FLT,
a shield conductive line $CL_{i-1}$, $CL_{i+1}$ is set in the floating state FLT when the bitline $BL_{i-1}$, $BL_{i+1}$ to which it is coupled receives the programming voltage Vhv.

Figure 4:
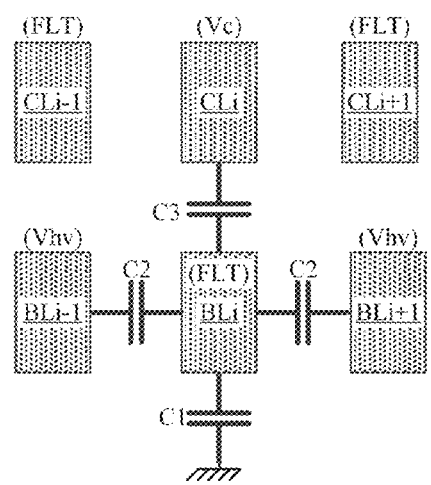
FIG. 4 is an electrical diagram illustrating a capacitive coupling of bitlines in the memory of FIG. 3, FIGS. 5, 5A, 6, and 6A show embodiments of programming latches according to the disclosure.

FIG. 4 is an electrical diagram equivalent to FIG. 3. A capacitance C1 represents the conventional capacitive coupling between the bitline $BL_i$ and the ground of the circuit. A capacitance C2 represents the conventional coupling between bitline $BL_i$ and each of the adjacent bitlines $BL_{i-1}$ and $BL_{i+1}$.

A capacitance C3 represents the capacitive coupling between floating bitline $BL_i$ and shield conductive line CL, receiving compensation voltage Vc. When the adjacent bitlines $BL_{i-1}$ and $BL_{i+1}$ receive voltage Vhv and bitline $BL_i$ is floating, bitline $BL_i$ is brought to a potential Vf2 that may be estimated by means of the following equation, supposing that Vc=0:

$$Vf2=2Vhv*C2/(C1+2C2+C3) \quad \text{(equation 2)}.$$

By comparing equation 2 with equation 1 which determines the parasitic potential Vf1 of a bitline present in a conventional memory, it follows that:

$$Vf2/Vf1=2Vhv*C2/(C1+2C2+C3)/2Vhv*C2/(C1+2C2)$$

that is:

$$Vf2/Vf1=(C1+2C2)/(C1+2C2)+C3.$$

It therefore may be noted that the potential Vf2 is less than the potential Vf1. As a numerical example, if C1=C2=C3:

$$Vf2=\tfrac{3}{4}Vf1.$$

Such a reduction of the parasitic potential Vf2 considerably reduces the risk of involuntarily programming memory cells. If for example Vf1=8.7 V, then Vf2=6.5 V. As the programming of memory cells is due to the injection of charges by the tunnel effect, the risk of involuntarily programming may be large at 8.7 V and practically inexistent at 6.5 V, if 6.5 V is less than an injection threshold by tunnel effect. It will be noted that the injection threshold is a parameter that is, to some extent, technologically controllable, for example by controlling a tunnel oxide thickness.

Voltage Vhv is generally applied to the bitlines by programming latches, each receiving the value of a bit to program in a memory cell. If this value is 1 for example, a programming latch supplies voltage Vhv, and if this value is 0 the latch sets the bitline in the floating state.

Figure 5:
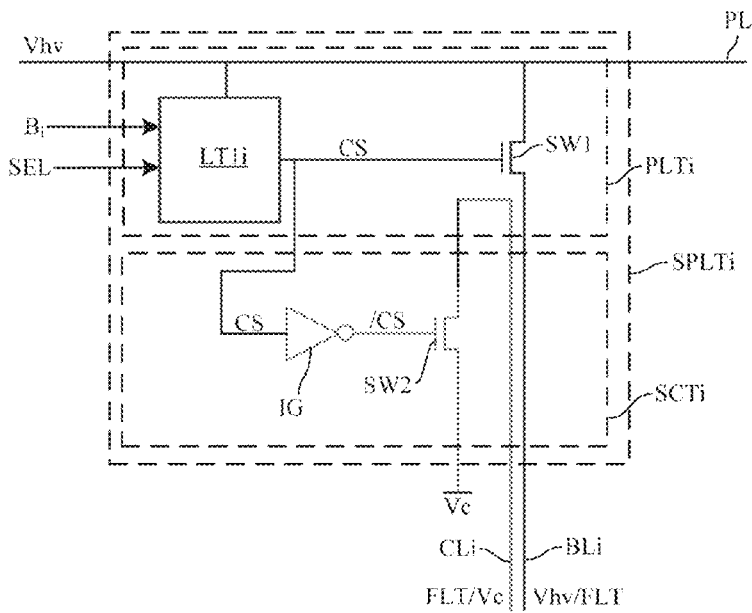

FIG. 5 shows a shield and programming latch $SPLT_i$ performing both the control of the voltage of a bitline $BL_i$ and the control of the voltage of shield conductive line $CL_i$ associated with bitline $BL_i$.

Shield and programming latch $SPLT_i$ comprises a conventional programming latch $PLT_i$ and a shield control circuit $SCT_i$ controlled by programming latch $PLT_i$.

Programming latch $PLT_i$ comprises a switch transistor SW1 controlled by a binary latch $LT1_i$. Transistor SW1 links bitline $BL_i$ to a programming line PL receiving voltage Vhv. Binary latch $LT1_i$ is electrically supplied by programming line PL. It receives a data bit $B_i$ and a selection signal SEL, and supplies a control signal CS to transistor SW1. For example, signal CS goes to 1 when bit $B_i$ and signal SEL are equal to 1. When signal CS is equal to 1, transistor SW1 conducts and bitline $BL_i$ receives voltage Vhv. More precisely, bitline $BL_i$ receives a voltage equal to Vhv−Vtn, Vtn being the threshold voltage of switch transistor SW1. For reasons of simplicity, this threshold voltage will be considered here as zero. When signal CS is equal to 0, bitline $BL_i$ is floating.

Shield control circuit $SCT_i$ comprises an inverting gate IG and a switch transistor SW2 that links shield conductive line $CL_i$ to a circuit node supplying compensation voltage Vc (for example ground). Inverting gate IG receives signal CS and supplies an inverted signal /CS to transistor SW2. Transistor SW2 conducts when signal/CS is at 1. The table below summarizes the functioning of the shield and programming latch $SPLT_i$.

| Bit | SEL | CS | Bitline $BL_i$ | Shield conductive line $CL_i$ |
|---|---|---|---|---|
| 0 | 0 | 0 | Floating | Vc |
| 1 | 0 | 0 | Floating | Vc |
| 0 | 1 | 0 | Floating | Vc |
| 1 | 1 | 1 | Vhv | Floating |

Figure 6:
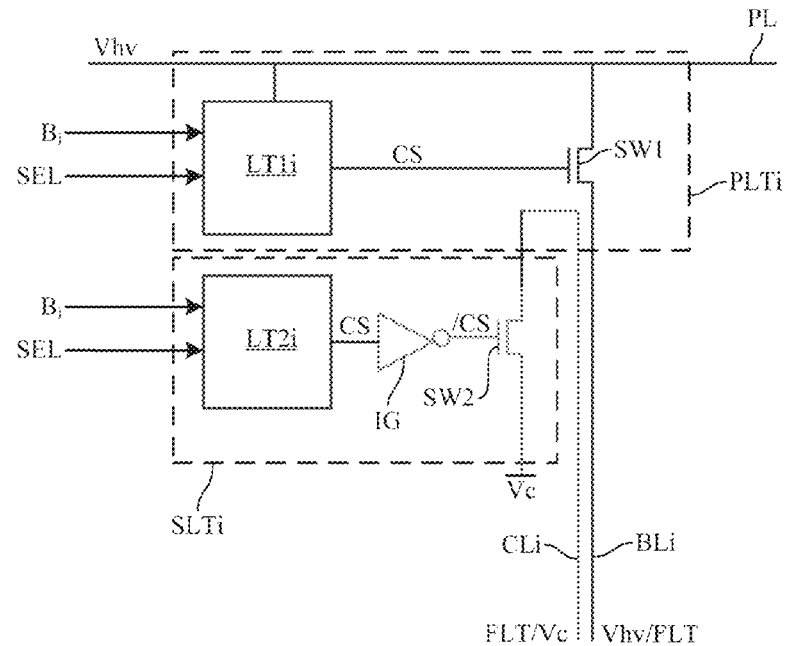

Alternatively, as shown in FIG. 6, a shield latch $SLT_i$ distinct from programming latch $PLT_i$ may be provided to perform the voltage control of shield conductive line $CL_i$. Shield latch $SLT_i$ comprises a binary latch $LT2_i$, inverting gate IG, and transistor SW2. Binary latch $LT2_i$ receives data bit $B_i$ and selection signal SEL, and its output supplies the same control signal CS as binary latch $LT1_i$ to the inverting gate IG. Table 1 above also summarizes the functioning of the combined shield latch $SLT_i$ and programming latch $PLT_i$, which is identical to the functioning of the shield and programming latch $SPLT_i$.

Figure 5A:
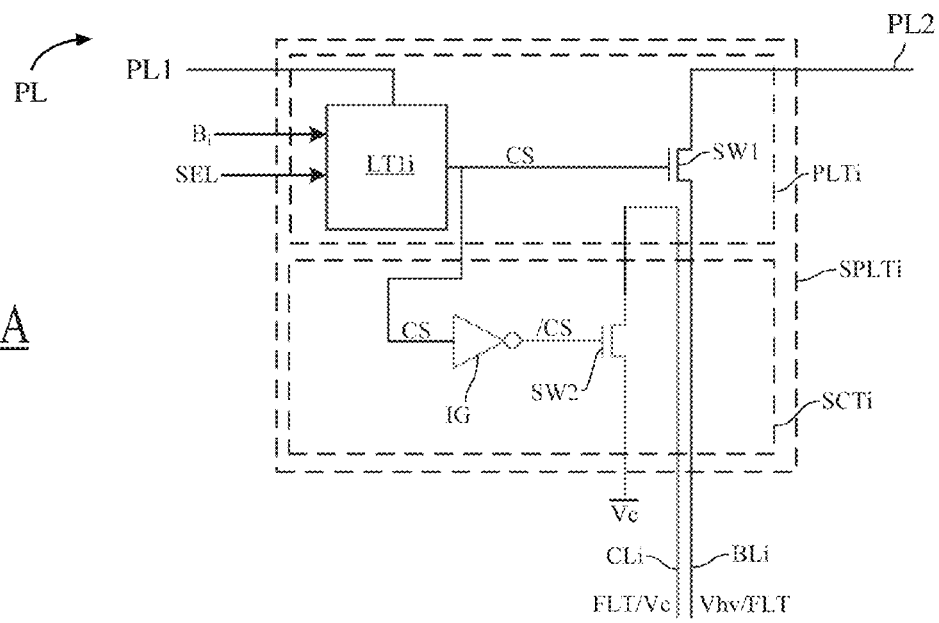
Figure 6A:
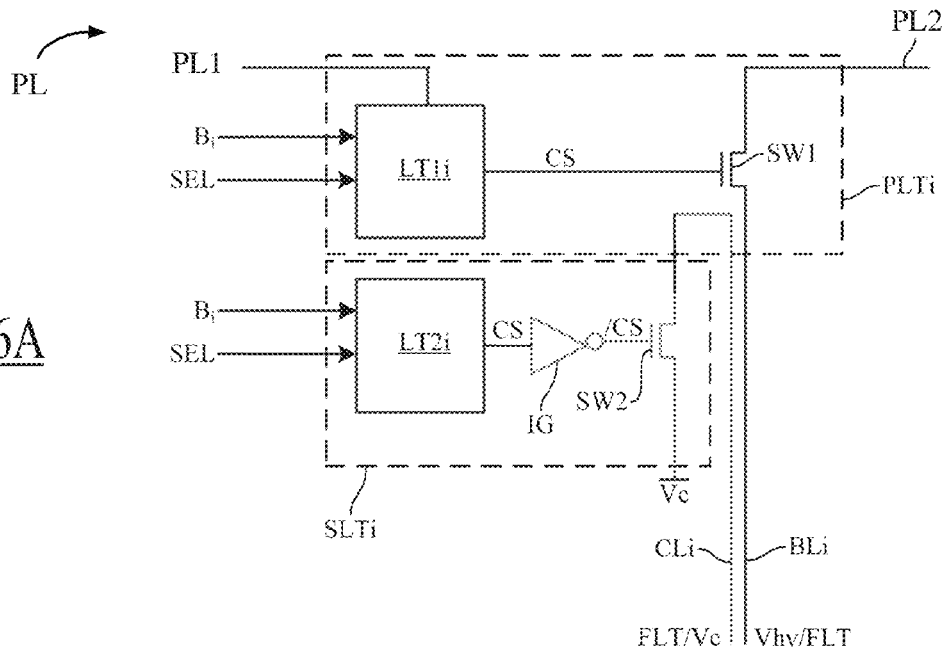

In an embodiment of latches shown in FIGS. 5A, 6A, programming line PL comprises two conductive tracks PL1, PL2. Track PL1 electrically supplies binary latch $LT1_i$ and track PL2 is linked to bitline $BL_i$ by the intermediary of switch SW1. This embodiment allows for example the application of a supply voltage Vdd to the binary latch $LT1_i$ via track PL1 to charge bit $B_i$ before an erase phase, and to maintain the binary latch active during the erase phase, whereas track PL2 is grounded. During the actual programming phrase, tracks PL1, PL2 receive voltage Vhv.

Figure 7:
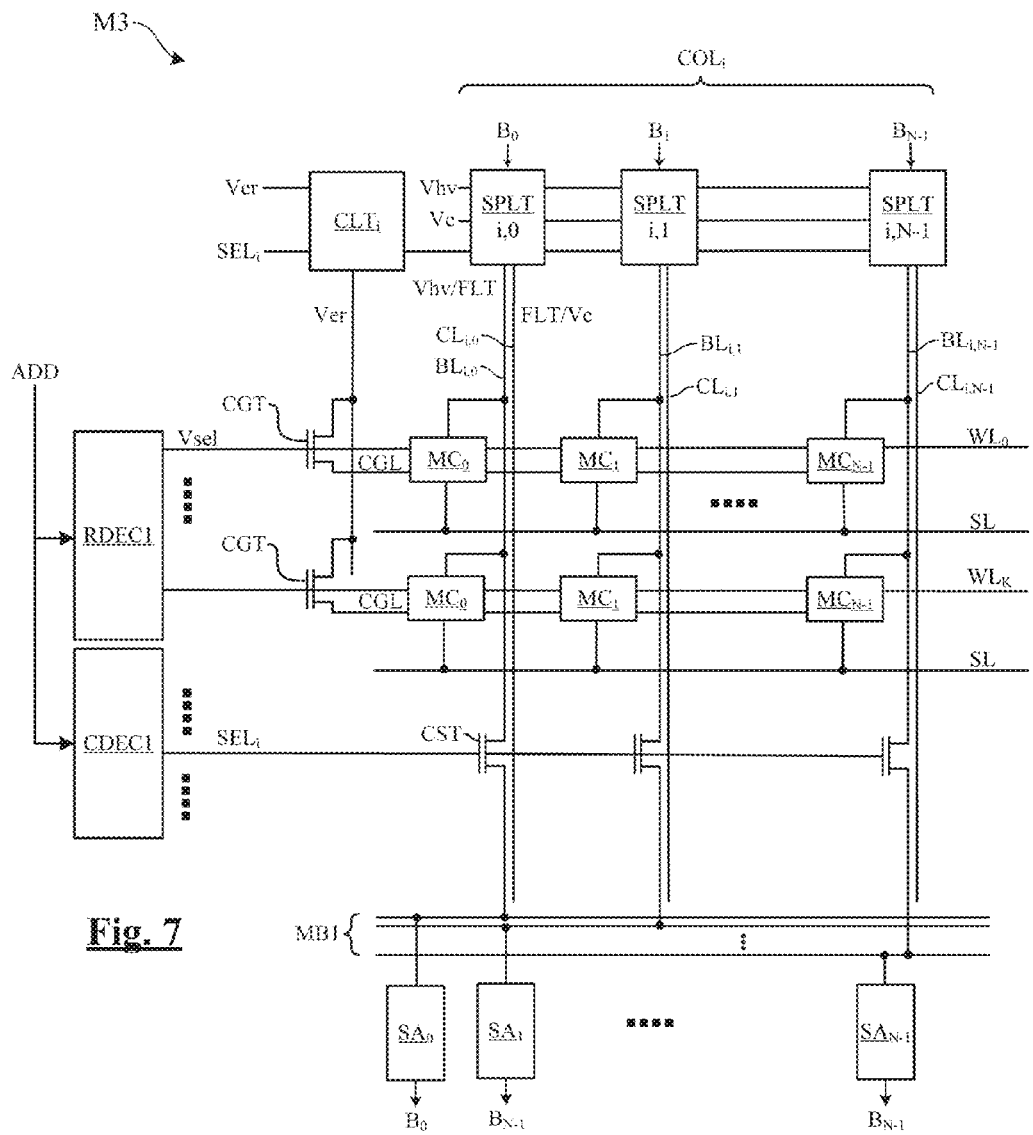
FIG. 7 shows a first embodiment example of a nonvolatile memory according to the disclosure.

FIG. 7 shows an implementation example of a nonvolatile memory M3 according to the disclosure, of the EEPROM type. The memory comprises horizontal rows and vertical rows of memory cells MC, wordlines WL, bitlines BL, and source lines SL.

Figure 8:
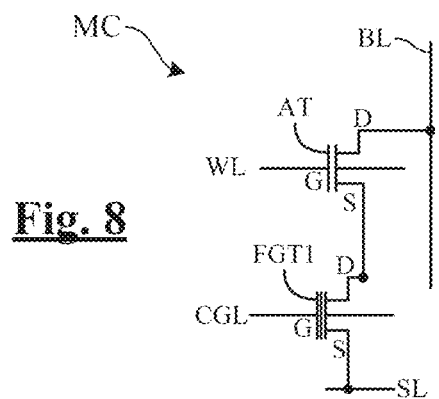
FIG. 8 shows the structure of memory cells shown in block form in FIG. 7.

The memory cell MC structure is shown in FIG. 8. Each memory cell comprises an access transistor AT in series with a floating gate transistor FGT1 of the tunnel effect programmable and erasable type. Transistor AT has its drain D linked to a bitline BL, its source S linked to the drain of transistor FGT1 and its gate G linked to a wordline WL. Transistor FGT1 has its gate G linked to a control gate line CGL and its source linked to a source line SL.

In reference to FIG. 7, bitlines BL are grouped in word columns $COL_i$ comprising N bitlines $BL_{i,0}, BL_{i,1} \ldots BL_{i,N-1}$. Only a single column $COL_i$ is shown in FIG. 7 for legibility of the figure. The gates G of floating gate transistors FGT1 of memory cells $MC_0, MC_1, \ldots MC_{N-1}$ of a same horizontal row and of a same column $COL_i$ are linked to a column latch column $CLT_i$ by the intermediary of a control gate transistor CGT and a control gate line CGL. The gates G of access transistors AT of memory cells $MC_0, MC_1, \ldots MC_{N-1}$ of a same horizontal row are connected to a same wordline WL ($WL_0 \ldots WL_K$), as well as the gate of the control gate transistors CGT.

Wordlines WL are controlled by a row decoder RDEC1 that applies to them selection or non-selection voltages as a function of an address value ADD received on its input.

The drain terminals D of access transistors AT of memory cells $MC_0, MC_1, \ldots MC_{N-1}$ of a same vertical row are connected to a same bitline BL ($BL_{i,0}, BL_{i,1} \ldots BL_{i,N-1}$). Each bitline BL is overlaid by a shield conductive line CL ($CL_{i,0}, CL_{i,1} \ldots CL_{i,N-1}$). Each pair of lines comprising a bitline BL and the corresponding shield conductive line CL is controlled by a shield and programming latch SPLT ($SPLT_{i,0}, SPLT_{i,1} \ldots SPLT_{i,N-1}$) of the type described above.

The bitlines of each column are equally linked to sense amplifiers SA ($SA_0, SA_1, \ldots SA_{N-1}$) by the intermediary of column selection transistors CST and a multiplexing bus MB1. The column selection transistors CST are controlled by column selection signals $SEL_i$ supplied by a column decoder CDEC1 receiving address ADD. Each selection signal $SEL_i$ of a column $COL_i$ is also applied to shield and programming latches SPLT ($SPLT_{i,0}$, $SPLT_{i,1}$ ... $SPLT_{i,N-1}$) linked to bitlines of this column, as well as to the corresponding column latch $CLT_i$. During phases of reading the memory, sense amplifiers SA supply bits $B_0, B_1 ... B_{N-1}$ read in the memory cells belonging to a horizontal row selected by decoder RDEC1 and a column $COL_i$ selected by the decoder CDEC1.

Now will be described, as an example only, a sequence of erasing and programming a binary word of N bits stored by the memory cells linked to wordline $WL_0$ and belonging to column $COL_i$.

Preparation of the Erase-Program Cycle

Shield and programming latches SPLT ($SPLT_{i,0}$, $SPLT_{i,1}$ ... $SPLT_{i,N-1}$) receive voltage Vc previously described, as well as the bits $B_0, B_1 ... B_{N-1}$ to program in the memory cells. A programming line PL is used with two conductive tracks PL1, PL2 of the type described above. The track PL1, which supplies the binary latches LT1 of the screen and programming latches SPLT, receives the supply voltage Vdd of the circuit (generally comprised between 1.8 V and 5 V), whereas track PL2, linked to the bitlines BL, is grounded. Decoder CDEC1 activates column latch $CLT_i$ and the latches SPLT by means of selection signal $SEL_i$.

Erase: depending on the bit value that they received, latches $SPLT_{i,0}$, $SPLT_{i,1}$ ... $SPLT_{i,N-1}$ set bitlines $BL_{i,0}$, $BL_{i,1}$ ... $BL_{i,N-1}$ of column $COL_i$ in the floating state or apply to them the zero voltage present on track PL2 of programming line PL, this detail being unimportant to the erase process. Column latch $CLT_i$ applies an erase voltage Ver to control gate line CGL by the intermediary of the transistor CGT. Decoder RDEC1 applies a selection voltage Vsel to wordline $WL_0$, chosen in a manner such that transistor CGT lets the voltage Ver pass (at about the threshold voltage of the transistors). Source line SL is connected to ground. Transistors FGT1 thus receive voltage Ver on their gates G whereas their sources S are grounded. Electrical charges are extracted by tunnel effect from the floating gates of transistors FGT1.

Program: voltage Vhv is applied to the two tracks PL1, PL2 of the programming line PL, such that the shield and programming latches $SPLT_{i,0}$, $SPLT_{i,1}$ ... $SPLT_{i,N-1}$ now receive voltage Vhv. Decoder RDEC1 applies a selection voltage Vsel to wordline $WL_0$ so that control gate transistor CGT is conducting. Column latch $CLT_i$ grounds control gate line CGL by the intermediary of control gate transistor CGT. Source line SL is set in the floating state. The shield and programming latches SPLT that received a bit equal to 1 apply high voltage Vhv to the bitlines that they control, and set the corresponding shield conductive lines in the floating state. The shield and programming latches SPLT that received a bit equal to 0 set the bitlines that they control in the floating state, and apply the compensation voltage Vc to the corresponding shield conductive lines. Electrical charges are injected by tunnel effect in the floating gates of transistors FGT1 receiving voltage Vhv.

Figure 9:
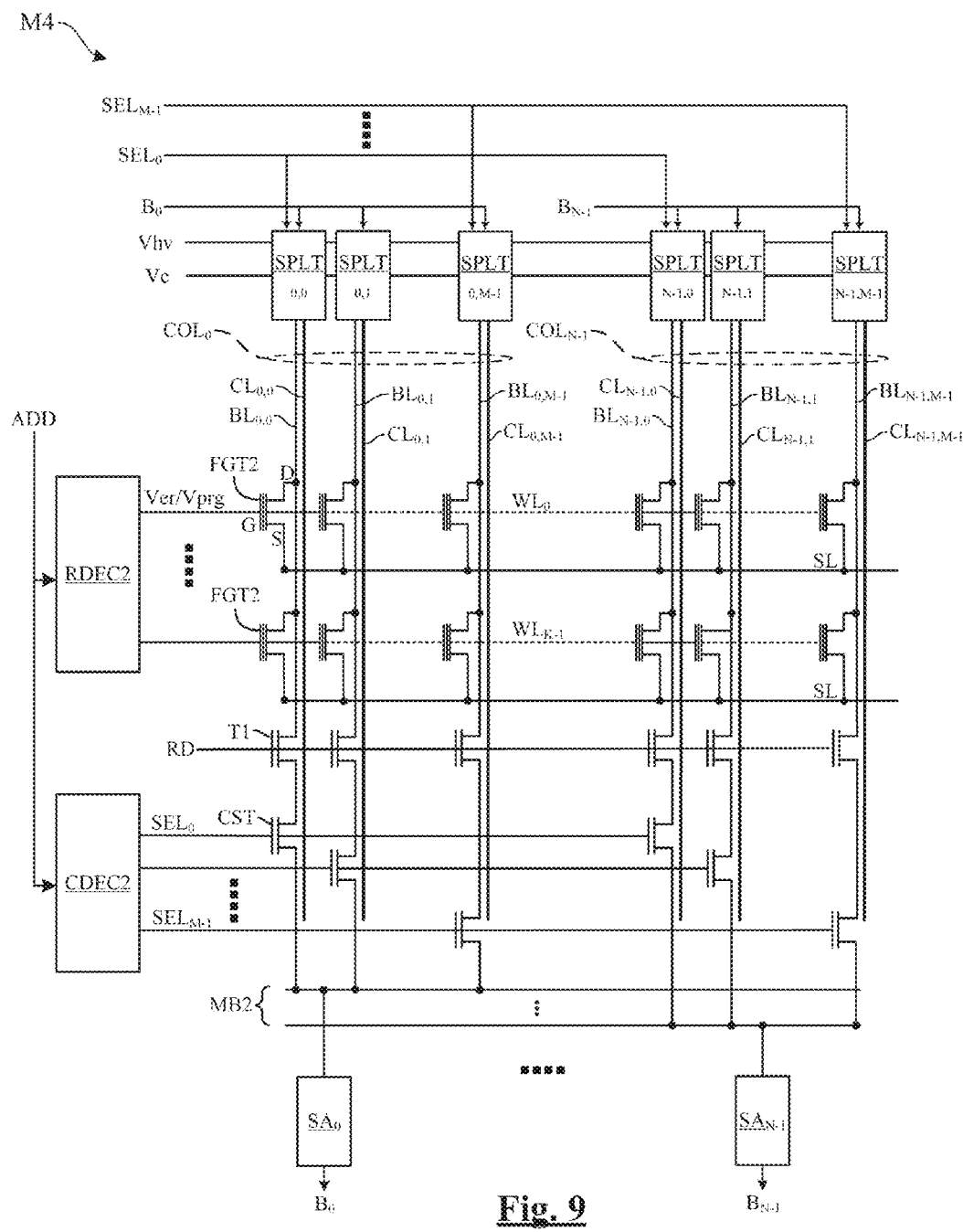
FIG. 9 shows a second embodiment example of a nonvolatile memory according to the disclosure.

FIG. 9 shows an embodiment example of a nonvolatile memory M4 according to the disclosure, of the FLASH type, of floating gate transistors FGT2, each forming a memory cell deprived of an access transistor. The memory comprises wordlines $WL_k$ ($WL_0$ to $WL_{K-1}$) and bitlines $BL_{n,m}$ ($BL_{0,0}$-$BL_{0,M-1}$, ... $BL_{N-1,0}$-$BL_{N-1,M-1}$). The bitlines $BL_{n,m}$ are grouped in columns $CL_n$ ($CL_0, ... CL_{N-1}$). Each column $CL_n$ comprises M bitlines $BL_{n,0}$-$BL_{n,M-}$. In contrast to memory M3, wherein the columns receive bits of different ranks forming a binary word, the columns of memory M4 receive bits of the same rank of different words.

Transistors FGT2 are arranged in horizontal rows and in vertical rows. The gates G of transistors FGT2 of a same horizontal row are connected to a same wordline $WL_k$ and the sources of these transistors are connected to a source line SL. The drains of transistors FGT2 of a vertical row are connected to the same bitline $BL_{n,m}$.

The bitlines are linked to sense amplifiers $SA_0$-$SA_{N-1}$ by the intermediary of isolation transistors TI, selection transistors CST, and a multiplexing bus MB2. Isolation transistors TI are controlled by a read signal RD and are blocked during erasing and programming phases of the memory. When the memory is in the read phase, the output of each sense amplifier $SA_n$ supplies the value of a bit $B_n$ ($B_0$-$B_{N-1}$) of a word read in the memory.

Memory M4 also comprises shield conductive lines $CL_{n,m}$ ($CL_{0,0}$-$CL_{0,m-1}$, ... $CL_{N-1,0}$-$CL_{N-1,M-1}$), each overlying a bitline, and shield and programming latches $SPLT_{n,m}$ ($SPLT_{0,0}$-$SPLT_{0,M-1}$, ... $SPLT_{N-1,0}$-$SPLT_{N-1,M-1}$).

A row decoder RDEC2 and a column decoder CDEC2 receive a binary word address ADD. Row decoder RDEC2 applies a gate control voltage to each wordline $WL_k$. The value of the gate control voltage depends on the state, selected or non selected, of the wordline, which is a function of the address ADD.

Column decoder CDEC2 supplies selection signals SEL ($SEL_0 ... SEL_{M-1}$) that are also a function of the value of the address ADD. A selection signal SEL of determined rank is applied to the shield and programming latches of the same rank in each column, as well as to the selection transistors CST of bitlines of corresponding rank. For example, signal $SEL_0$ is applied to the first latches $SPLT_{0,0}$-$SPLT_{N-1,0}$ of each column and to the selection transistors CST of corresponding bitlines. Signal $SEL_{M-1}$ is applied to latches $SPLT_{0,M-1}$-$SPLT_{N-1,M-1}$ of each column and to selection transistors CST of the corresponding bitlines.

Now will be described, as an example, a step of erasing all the memory cells connected to wordline $WL_0$ (page erase) and a step of programming a binary word in memory cells connected to this wordline $WL_0$ and to the first bitline $BL_{n,0}$ of each column $COL_0$-$COL_{N-1}$.

Erase: Row decoder RDEC2 applies an erase voltage Ver to wordline $WL_0$. Source line SL is grounded. Electrical charges are extracted by tunnel effect from the floating gates of all the transistors FGT2 connected to wordline $WL_0$.

Program: The shield and programming latches $SPLT_{n,m}$ receive voltages Vhv, Vc previously described, and bits $B_0$, $B_1 ... B_{N-1}$ to program in the memory cells. Column decoder CDEC2 activates the shield and programming latches $SPLT_{n,0}$ controlling the first bitline $BL_{n,0}$ of each column. Row decoder RDEC2 applies a programming selection voltage Vprg to wordline $WL_0$. The shield and programming latches SPLT that received a bit equal to 1 apply programming voltage Vhv to the bitlines that they control, and set the corresponding shield conductive lines in the floating state. The shield and programming latches SPLT that received a bit equal to 0 set the bitlines that they control in the floating state, and apply compensation voltage Vc to the corresponding shield conductive lines. Electrical charges are injected in the floating gates of transistors FGT2 receiving voltage Vhv.

Figure 10:
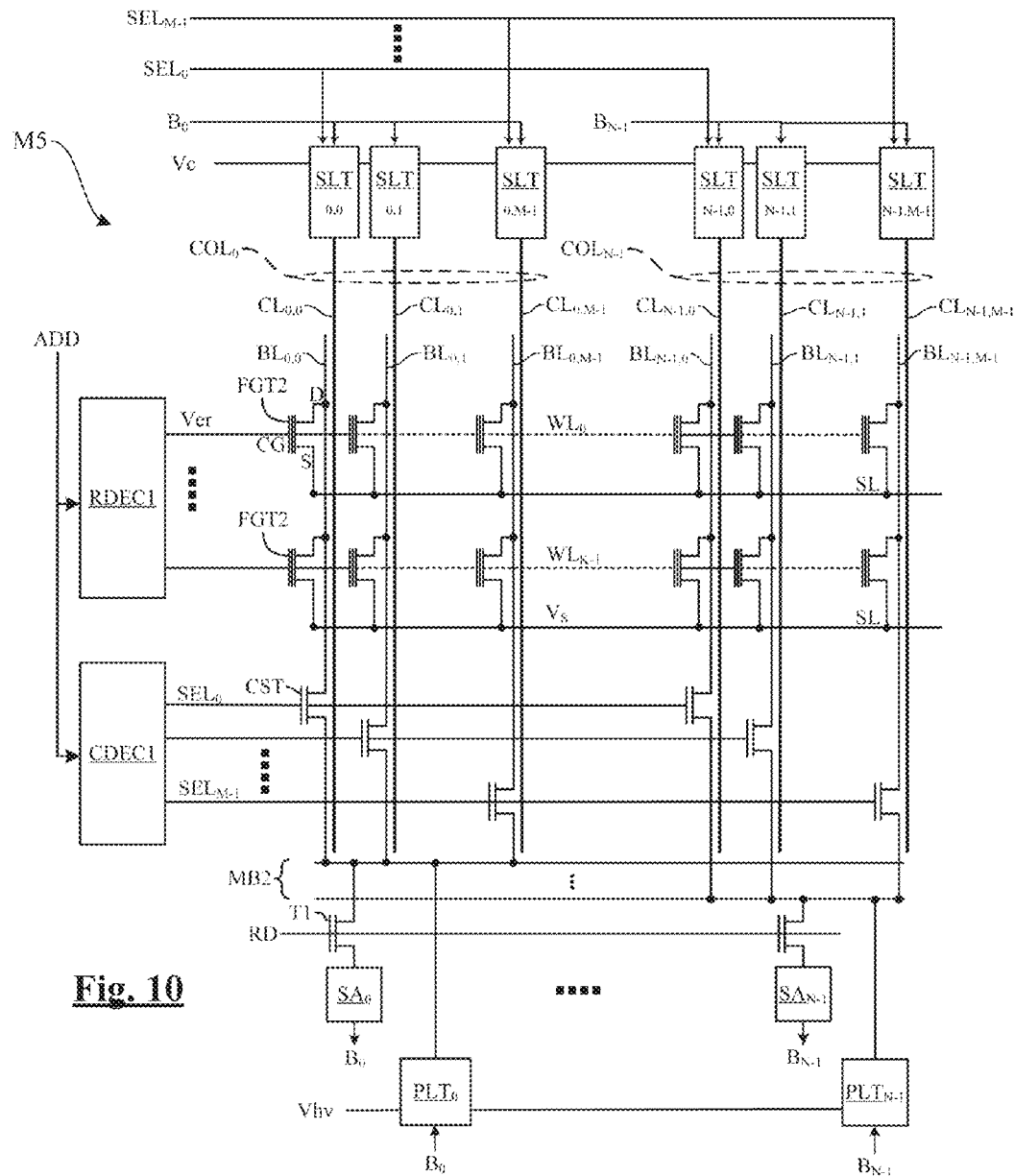
FIG. 10 shows a third embodiment example of a nonvolatile memory according to the disclosure.

FIG. 10 shows a memory M5 that differs from memory M4 in that the shield and programming latches $SPLT_{n,m}$ are replaced by separate shield latches $SLT_{n,m}$ and programming latches $PLT_0$-$PLT_{N-1}$, such as those previously described in relation with FIG. 6. The shield latches $SLT_{n,m}$ are arranged instead of and in the place of the shield and programming latches SPLT$_{n,m}$ of memory M4, and are connected to the shield conductive lines. Programming latches PLT$_0$-PLT$_{N-1}$ are arranged at the bottom of the memory array and are linked to the bitlines BL by the intermediary of multiplexing bus MB2 and selection transistors CST. Isolation transistors TI controlled by the read signal RD are arranged between the inputs of sense amplifiers SA$_0$-SA$_{N-1}$ and the multiplexing bus MB2.

Figure 11:
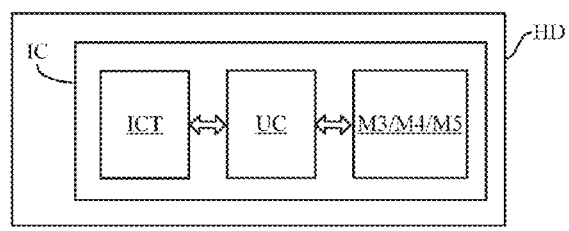
FIG. 11 shows a device equipped with a nonvolatile memory according to the disclosure.

FIG. 11 schematically shows a portable device HD comprising an integrated circuit IC according to the disclosure. Integrated circuit IC comprises a memory according to the disclosure, for example M3, M4, or M5, a central unit UC, and a communication interface circuit ICT. Communication interface circuit ICT may be of the contact type, for example an ISO 7816 interface circuit, or of the contactless type, for example an ISO14443 or ISO15693 interface circuit functioning by inductive coupling. Portable device HD is for example a chipcard or an electronic tag. Device HD may be generally any type of device equipped with a nonvolatile memory.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A nonvolatile memory comprising:
   a first bitline and a first memory cell linked to the first bitline,
   a first bitline control circuit configured to alternately apply a programming voltage to the first bitline and set the first bitline in a floating state,
   a first shield conductive line extending above the first bitline and capacitively coupled to the first bitline, and
   a shield control circuit configured to:
      apply a compensation voltage to the first shield conductive line while the first bitline is in the floating state, and
      set the first shield conductive line in the floating state while the programming voltage is applied to the first bitline.

2. The memory according to claim 1, wherein:
   the first bitline control circuit includes a first control switch coupled in series with the first bitline, and a first latch configured to store a first data bit and supply a control signal to a control terminal of the first control switch as a function of the first data bit, and
   the shield control circuit includes a second control switch coupled in series with the shield conductive line, and a second latch configured to store a second data bit and supply a control signal to a control terminal of the second control switch as a function of the second data bit.

3. The memory according to claim 1, wherein:
   the first bitline control circuit includes a first control switch coupled in series with of the bitline, and a latch configured to store a data bit and supply a control signal to a control terminal of the first control switch as a function of the data bit, and
   the shield control circuit includes a second control switch coupled in series with the shield conductive line, the latch being coupled to a control terminal of the second control switch and configured to control the second control switch as a function of the data bit.

4. The memory according to claim 3, wherein the shield control circuit includes an inverting gate configured to produce an inverted control signal from the control signal and control the second control switch with the inverted control signal.

5. The memory according to claim 1, wherein the compensation voltage is a ground potential of the memory.

6. The memory according to claim 1, comprising:
   rows of memory cells including the first memory cell,
   a plurality of second bitlines capacitively coupled to the first bitline and positioned on opposite sides of the first bitline, and
   a plurality of second shield conductive lines arranged above the second bitlines, respectively,
   a second bitline control circuit configured to set the second bitlines in the floating state while the programming voltage is applied to the first bitline, and
   a plurality of second shield control circuits configured to apply the compensation voltage to the second shield conductive lines while the programming voltage is applied to the first bitline.

7. The memory according to claim 1, wherein the first memory cell comprises an access transistor and a floating gate transistor.

8. The memory according to claim 1, wherein the first memory cell comprises a floating gate transistor without an access transistor.

9. An electronic portable device comprising:
   an integrated circuit that includes:
   a nonvolatile memory according to claim 1.

10. The portable device according to claim 9, wherein:
    the first bitline control circuit includes a first control switch coupled in series with the first bitline, and a first latch configured to store a first data bit and supply a control signal to a control terminal of the first control switch as a function of the first data bit, and
    the shield control circuit includes a second control switch coupled in series with the shield conductive line, and a second latch configured to store a second data bit and supply a control signal to a control terminal of the second control switch as a function of the second data bit.

11. The portable device according to claim 9, wherein:
    the first bitline control circuit includes a first control switch coupled in series with of the bitline, and a latch configured to store a data bit and supply a control signal to a control terminal of the first control switch as a function of the data bit, and
    the shield control circuit includes a second control switch coupled in series with the shield conductive line, the latch being coupled to a control terminal of the second control switch and configured to control the second control switch as a function of the data bit.

12. The portable device according to claim 11, wherein the shield control circuit includes an inverting gate configured to produce an inverted control signal from the control signal and control the second control switch with the inverted control signal.

13. The portable device according to claim 9, wherein the nonvolatile memory includes:
    rows of memory cells including the first memory cell,
    a plurality of second bitlines capacitively coupled to the first bitline and positioned on opposite sides of the first bitline, and
    a plurality of second shield conductive lines arranged above the second bitlines, respectively, a second bitline control circuit configured to set the second bitlines in the floating state while the programming voltage is applied to the first bitline, and a plurality of second shield control circuits configured to set the compensation voltage to the second shield conductive lines while the programming voltage is applied to the first bitline.

14. A method, comprising:

programming memory cells in a nonvolatile memory that includes plural bitlines, memory cells coupled to the bitlines, and shield conductive lines extending above and capacitively coupled to the bitlines, respectively, the programming including:

applying a programming voltage to a first bitline;

setting a second bitline in a floating state while applying the programming voltage to the first bitline; and applying, while applying the programming voltage to the first bitline, a compensation voltage to the shield conductive line capacitively coupled to the second bitline; and setting, while applying the programming voltage to the first bitline, in the floating state the shield conductive line capacitively coupled to the first bitline.

15. The method according to claim 14, wherein the compensation voltage is a ground potential.

16. The method according to claim 14, wherein:

applying the programming voltage to the first bitline includes supplying a first control signal to a control terminal of a first control switch coupled to the bitline;

supplying the first control signal includes using a first latch to supply the first control signal as a function of a value of a data bit stored by the first latch;

applying the compensation voltage to the shield conductive line capacitively coupled to the second bitline includes supplying a second control signal to a control terminal of a second control switch coupled to the shield conductive line capacitively coupled to the second bitline; and supplying the second control signal includes using a second latch to supply the second control signal as a function of a value of a data bit stored by the second latch.

17. The method according to claim 14, wherein:

applying the programming voltage to the first bitline includes supplying a first control signal to a control terminal of a first control switch coupled to the bitline;

supplying the first control signal includes using a first latch to supply the first control signal as a function of a value of a data bit stored by the first latch, and applying the compensation voltage to the shield conductive line capacitively coupled to the second bitline includes supplying a second control signal to a control terminal of a second control switch coupled to the shield conductive line capacitively coupled to the second bitline; and supplying the second control signal includes supplying the second control signal as a function of a value of the first control signal.

* * * * *